US006821129B2

(12) United States Patent
Tsuchiya

(10) Patent No.: US 6,821,129 B2
(45) Date of Patent: Nov. 23, 2004

(54) CONNECTION DEVICE FOR STABILIZING A CONTACT WITH EXTERNAL CONNECTORS

(75) Inventor: Junji Tsuchiya, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 10/761,589

(22) Filed: Jan. 20, 2004

(65) Prior Publication Data

US 2004/0152346 A1 Aug. 5, 2004

(30) Foreign Application Priority Data

Jan. 28, 2003 (JP) ........................................ 2003-018542

(51) Int. Cl.[7] .............................................. H01R 12/00
(52) U.S. Cl. ...................................... 439/66; 361/769
(58) Field of Search ............................ 439/66, 91, 591, 439/82; 361/773, 774, 769; 174/267

(56) References Cited

U.S. PATENT DOCUMENTS

| 5,973,394 | A | * | 10/1999 | Slocum et al. ................. 439/82 |
| 6,033,233 | A | * | 3/2000 | Haseyama et al. ............. 439/66 |
| 6,174,172 | B1 | * | 1/2001 | Kazama ........................ 439/66 |
| 6,202,297 | B1 | * | 3/2001 | Faraci et al. ................. 361/768 |
| 6,286,205 | B1 | * | 9/2001 | Faraci et al. ................. 361/78 |
| 6,287,126 | B1 | * | 9/2001 | Berger et al. ................. 439/66 |
| 6,328,573 | B1 | * | 12/2001 | Sakata et al. ................. 439/66 |
| 6,442,039 | B1 | * | 8/2002 | Schreiber ..................... 439/66 |
| 6,517,362 | B2 | | 2/2003 | Hirai et al. ................... 439/82 |
| 6,551,112 | B1 | * | 4/2003 | Li et al. ....................... 439/66 |
| 6,627,092 | B2 | * | 9/2003 | Clements et al. ............. 216/13 |

\* cited by examiner

Primary Examiner—Gary Paumen
Assistant Examiner—Briggitte R. Hammond
(74) Attorney, Agent, or Firm—Beyer, Weaver & Thomas LLP

(57) ABSTRACT

The present invention provides a connection device for stabilizing contact between the external connectors (spherical contactors) of electrical parts and spiral contactors.

As shown in FIG. 5A, the directions of the windings of adjacent spiral contactors 20 are opposite to each other. Further, as shown in FIG. 5B, when the directions of the windings of adjacent spiral contactors 20 are opposite to each other and the positions of forming the starting ends of the windings of adjacent spiral contactors 20 are formed in a difference of 180° between them, tensile stresses between adjacent spiral contactors 20 can cancel each other out. By doing so, since distortion generated in a substrate on which the spiral contactors 20 are provided can be minimized, contact between the spherical contactors and the spiral contactors 20 can be stabilized.

7 Claims, 5 Drawing Sheets

CONNECTION DEVICE FOR STABILIZING A CONTACT WITH EXTERNAL CONNECTORS

BACKGROUND OF THE INVENTION

1. Field of the Invention

The present invention relates to a connection device that is an IC socket on which ICs (integrated circuits) and the like are mounted, for example, and more particularly to a spiral contactor for making contact with the external connectors such as ICs and the like.

2. Description of the Related Art

A semiconductor inspecting device disclosed in patent document 1 is a device for temporarily bringing a semiconductor device into electrical contact with external circuit boards and the like. A plurality of spherical contactors arranged in the form of a lattice or a matrix is provided on the backside of the semiconductor device, a plurality of concaves is provided on the insulation substrate opposite the plurality of spherical contactors, and a plurality of spiral contactors is oppositely arranged in the plurality of concaves.

When the back side of the semiconductor device is pressed toward the insulation substrate, since the spiral contactors make contact with an outside surface of the spherical contactors in such a manner that the spiral contactors are spirally wound, electrical contact between the respective spherical contactors and the respective spiral contactors is reliably accomplished.

[Patent Document 1]

Japanese Unexamined Patent Application Publication No. 2002-175859

In a connection device disclosed in the patent document 1, when the spherical contactors press against the spiral contactors, the spiral contactors are pressed down into the concaves, and tensile stress along the tangential direction of the spiral contactors is applied to starting ends (ends of the substrate) of the windings of the spiral contactors.

However, since the winding directions of the spiral contactors are in the same direction, the tensile stress being applied to the starting end of each of the spiral contactors is forcefully applied to the substrate in the same direction.

Therefore, there is a fear that the contact state may be unstable due to distortion generated in the insulation substrate.

SUMMARY OF THE INVENTION

In consideration of the above problem, it is an object of the present invention to provide a connection device for stabilizing contact between the external connectors (spherical contactors) of electrical parts and spiral contactors.

In order to achieve the above object, a connection device comprises a substrate and a plurality of spiral contactors formed in a spiral shape on the substrate, a plurality of external connectors of electronic parts making contact with the plurality of spiral contactors, respectively, wherein the directions of tensile stresses applied to the starting ends of the windings of the spiral contactors are arranged to be opposite to each other between adjacent spiral contactors.

According to the above configuration of the present invention, since tensile stresses generated in the starting ends of the windings of the spiral contactors can cancel each other out between adjacent spiral contactors, the electrical connection between the external connectors and the spiral contactors can be stabilized.

However, although tensile stresses may cancel each other out between adjacent spiral contactors, tensile stresses may also cancel each other out in one block unit, for example, for each column of spiral contactors, each row of spiral contactors, or each of spiral contactors arranged in the form of a square.

As a preferred configuration of the spiral contactors, for example, the spiral directions of adjacent spiral contactors are opposite to each other, or the spiral directions of adjacent spiral contactors are the same, and the positions of the starting ends of the windings of the spiral contactors deviate from each other by 180°.

In the above configuration, preferably, the concaves are formed in the substrate, the starting ends of the windings of the spiral contactors are provided at the edge portions of the concaves, and the terminal ends of the windings of the spiral contactors are provided at the centers of the concaves.

In the above configuration, since the spiral contactors can vary in the concaves, connection between the spiral contactors and the external connectors can be reliably accomplished.

In addition, preferably, the concaves are arranged in the form of a matrix. This allows tensile stresses to be canceled more reliably.

In addition, preferably, the concaves are through-holes, the inner walls of which are provided with conductors, each being conductive with each of the spiral contactors.

In addition, preferably, the tip of each of the external connectors is in the form of a sphere. This allows the connection between the external connectors and the spiral contactors to be accomplished reliably.

DESCRIPTION OF THE PREFERRED EMBODIMENTS

Figure 1:
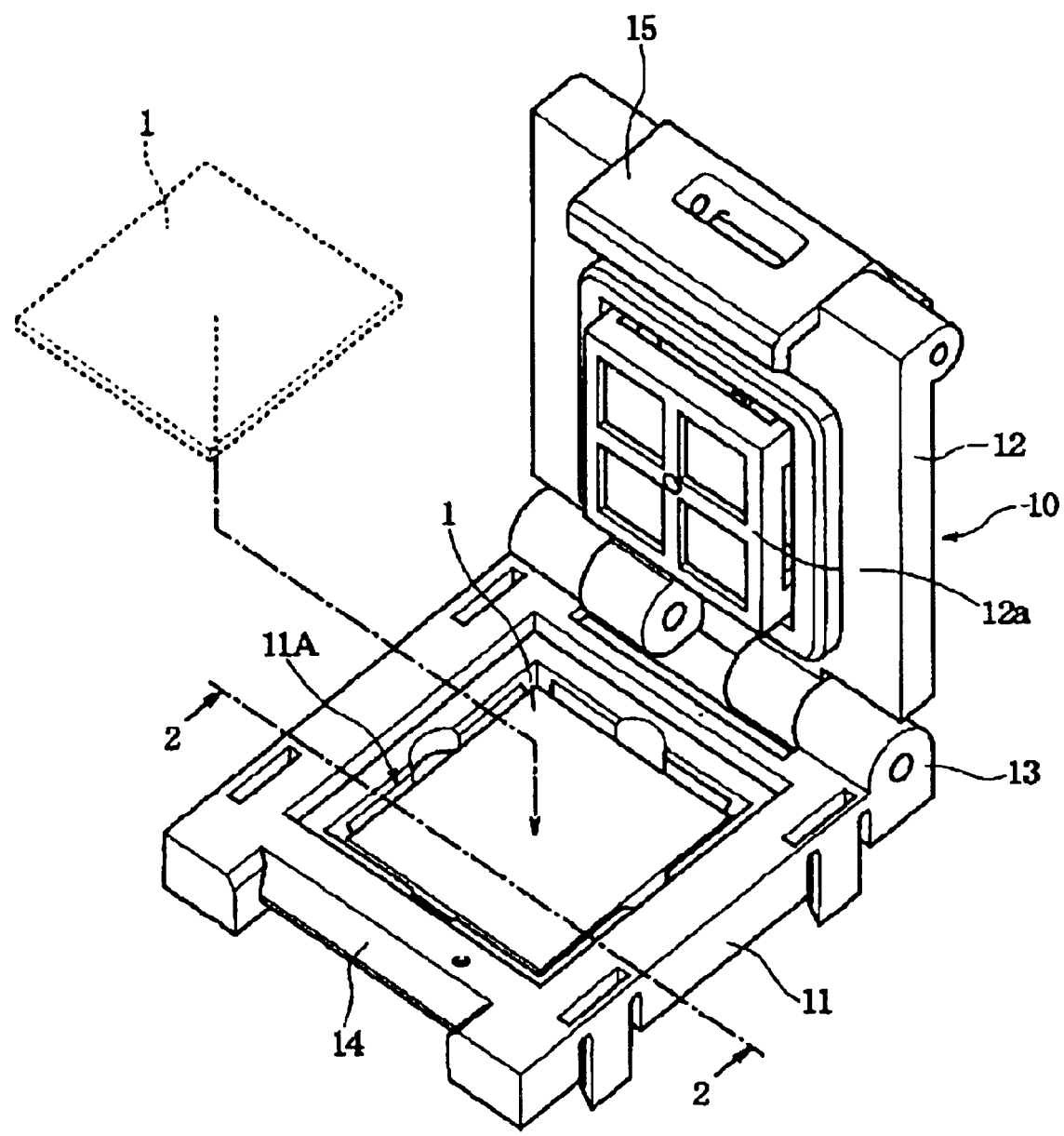
FIG. 1 is a perspective view illustrating an inspecting device for use with a test for confirming the operation of electrical parts.
Figure 2:
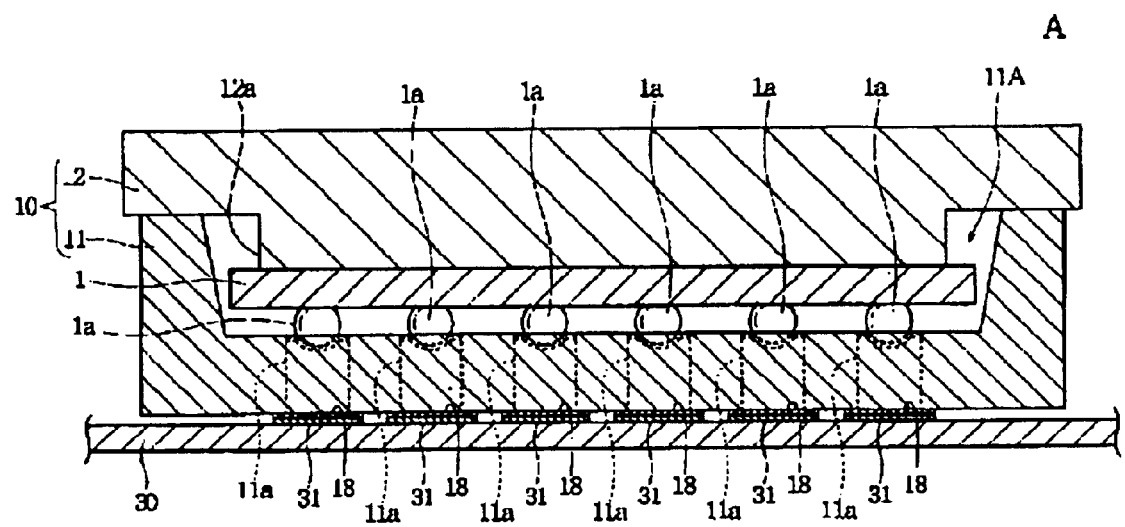
FIG. 2 is a cross-sectional view taken along the line 2—2 of FIG. 1, A being a cross-sectional view in a state where electronic parts are mounted and B being an enlarged cross-sectional view of A.
Figure 2:
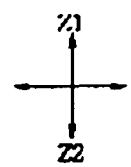
Figure 2:
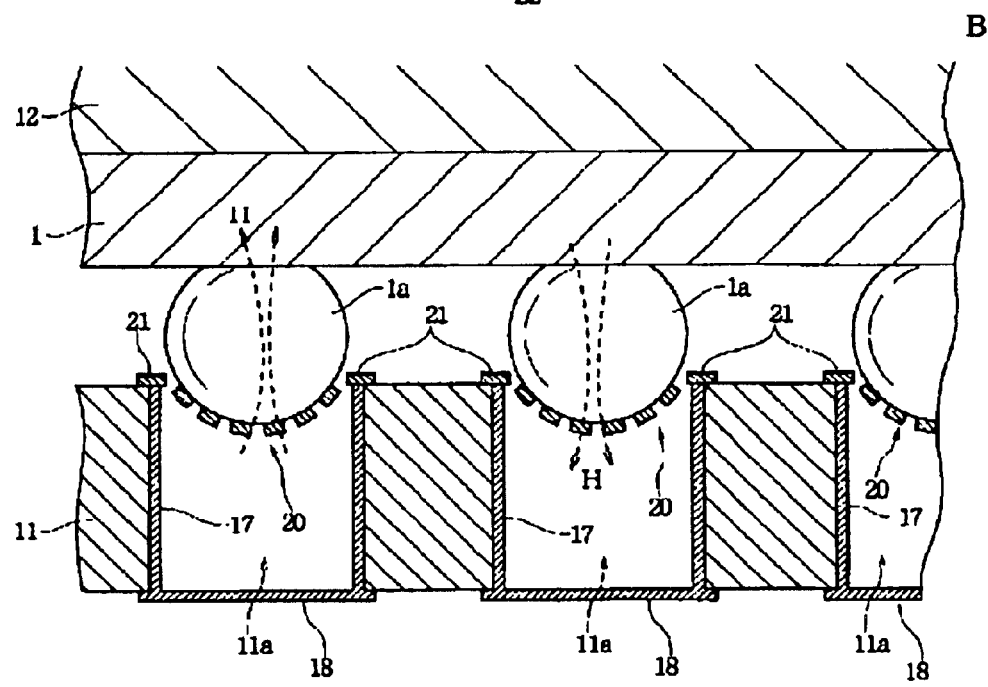
Figure 3:
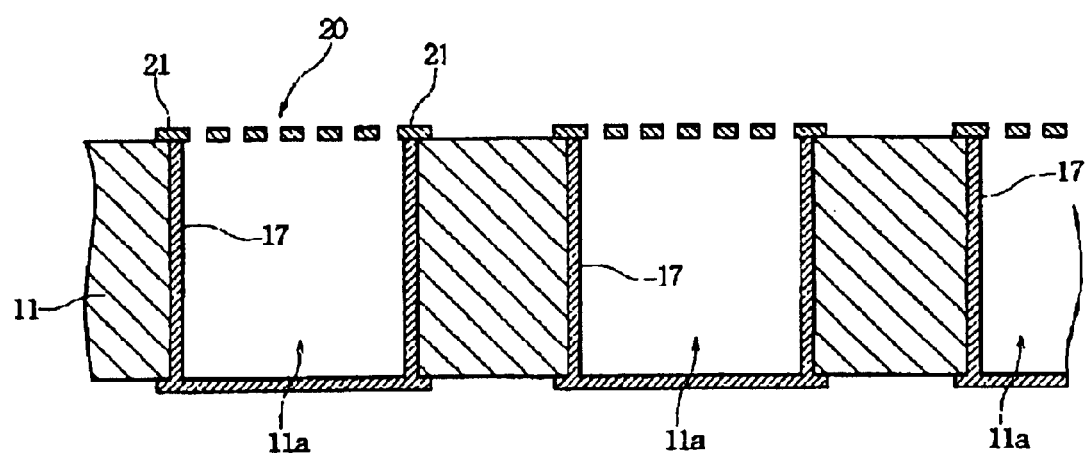
FIG. 3 is a cross-sectional view similar to FIG. 2B, in a state where the electronic parts are not mounted.
Figure 4:
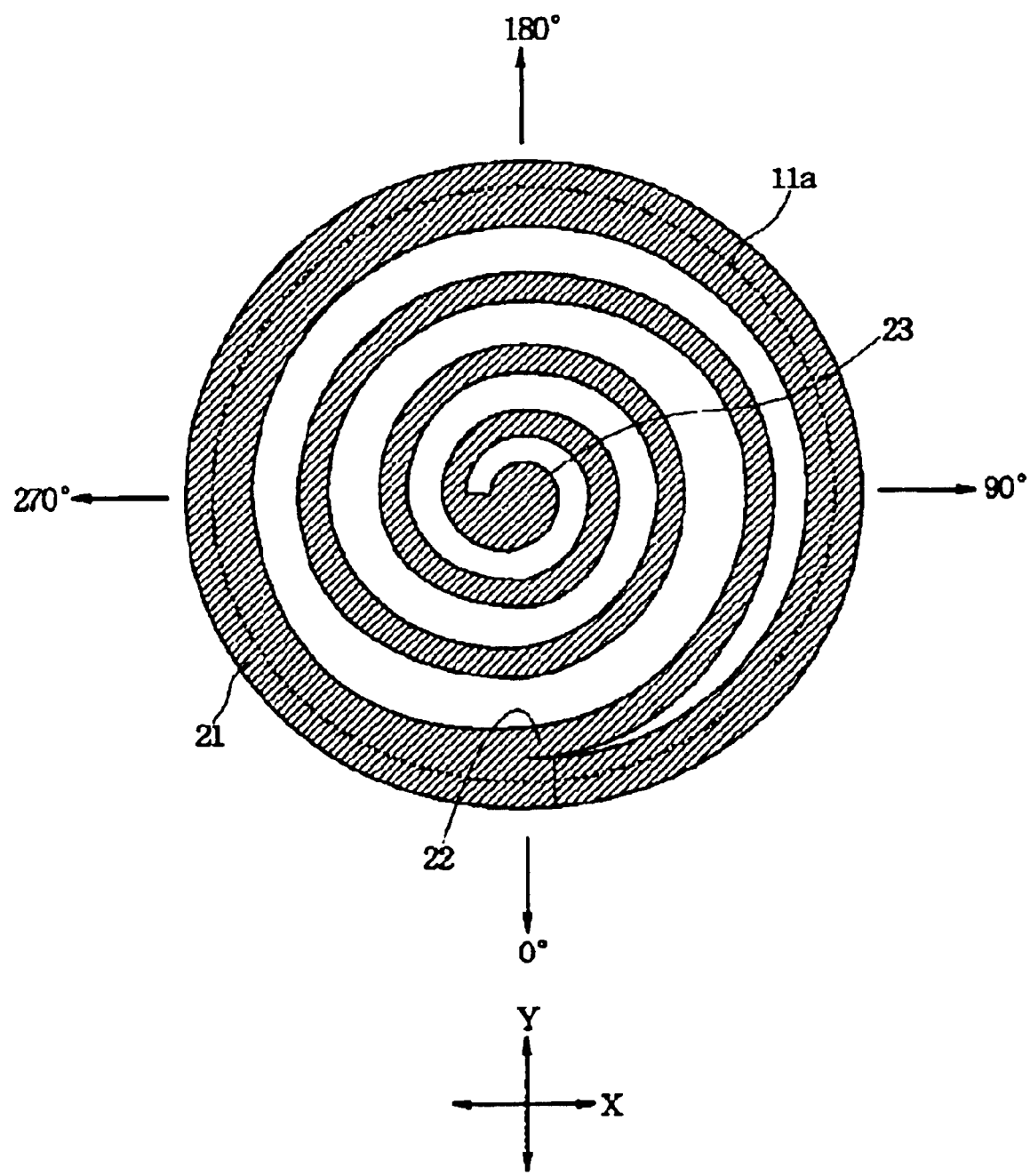
FIG. 4 is an enlarged plan view of a spiral contactor.

FIG. 1 is a perspective view illustrating an inspecting device for use with a test for confirming the operation of electrical parts. FIG. 2 is a cross-sectional view taken along the line 2—2 of FIG. 1, A being a cross-sectional view in a state where the electronic parts are mounted and B being an enlarged cross-sectional view of A of FIG. 2. FIG. 3 is a cross-sectional view similar to B of FIG. 2, in a state where the electronic parts are not mounted. FIG. 4 is an enlarged plan view of a spiral contactor.

As shown in FIG. 1, an inspecting device 10 is composed of a base stand 11 and a cover 12 rotatably supported by releasing a hinge portion 13 provided at the edge portion of one side of the base stand 11. The base stand 11 and the cover 12 are made of an insulating resin material and the like, and a loading region (substrate) 11A concaved toward the Z2 direction is formed at the center portion of the base stand 11. In addition, an electronic part 1, such as a semiconductor device, can be mounted into the loading region 11A. In addition, a locked portion 14 is formed at the edge portion of the other side of the base stand 11.

As shown in FIGS. 2A and 2B, test target of the inspecting device 10 is a plurality of spherical contactors (external connectors) 1a arranged in the form of a matrix (the lattice or eyes of checkerboard) on a lower surface of the electronic part 1.

As shown in FIGS. 2A and 2B and FIG. 3, in the loading region (substrate) 11A, a plurality of concaves (throughholes) 11a, having a predetermined diameter dimension and penetrating from the surface of the loading region 11A to the back side of the base stand 11, is provided in correspondence to the plurality of spherical contactors 1a of the electronic part 1.

A plurality of spiral contactors 20, having contactors in the form of a spiral, is provided on the upper sides of the concaves 11a (the surface of the loading region 11A). As shown in FIG. 3 and FIG. 4, the spiral contactors 20 are formed on the same plane, and a plurality of base portions 21 in the form of a ring is formed at the starting ends of the outside directions of the spiral contactors and is fixed at the edge portions at the ends of the openings in the upper sides of the concaves 11a.

As shown in FIG. 4, the starting end 22 of the winding of the spiral contactor 20 is provided on the base portion 21, and the terminal end 23 of the winding extending in the form of a spiral from the starting end 22 of the winding is provided at the center portion of the concave 11a. In addition, in FIG. 4, taking an angle in the counterclockwise direction, with the lower end in the Y direction as 0°, the starting end 22 of the winding of the spiral contactor 20 shown in FIG. 4 is formed at the position of an angle of 0°.

As shown in FIG. 2B and FIG. 3, plated conductive portions 17 are formed on the inner walls of the concaves 11a, and the upper ends of the conductive portions 17 and the base portions 21 of the spiral contactors 20 are connected to each other by conductive adhesive material and the like. In addition, the ends of the openings in the lower sides of the concaves 11a are blocked by connection terminals 18 connected to the conductive portions 17.

As shown in FIG. 2A, a printed board 30 having a plurality of wire patterns and other circuit parts is provided at the lower side of the base stand 11, which is fixed on the printed board 30. A plurality of opposite electrodes 31, opposite to the connection terminals 18 provided at the lower side of the base stand 11, is provided on the surface of the printed board 30. By contacting each of the connection terminals 18 with each of the counter electrodes 31, the electronic part 1 and the printed board 30 are electrically connected to each other through the inspecting device 10.

On the other hand, at the center position of the inner side of the cover 12 of the inspecting device 10, a pressing portion 12a in the form of a convex, to press the electronic part 1 in the down direction (shown), is provided against the loading region 11A. In addition, a locking portion 15 is formed at the position opposite to the hinge portion 13.

A biasing member (not shown) composed of a coil spring and the like, for biasing the pressing portion 12a in a direction far from the inner side of the cover 12, is provided between the inner side of the cover 12 and the pressing portion 12a. Accordingly, when the electronic part 1 is mounted into the concaves 11a and then the cover 12 is closed and locked, it becomes possible to elastically press the electronic part 1 in a direction (Z2 direction) approaching the surface of the loading region 11A.

The loading region 11A of the base stand 11 is nearly the same size as an appearance of the electronic part 1. Therefore, when the electronic part 1 is mounted into the loading region 11A and then the cover 12 is locked, each of the spherical contactors 1a of the electronic part 1 exactly correspond to each of the spiral contactors 20 of the inspecting device 10 so that a position relation between them can be definitely determined.

As shown in FIG. 2B, when the locking portion 15 of the cover 12 is locked in the locked portion 14 of the base stand 11, since the electronic part 1 is pressed down in the direction by the pressing portion 12a, each of the spherical contactors 1a presses down on each of the spiral contactors 20 in the inner direction (in a shown down direction) of the concaves 11a. At the same time, since appearances of the spiral contactors 20 are modified to be pressed and enlarged in the direction from the terminal ends 23 of the winding to the starting ends 22 of the winding (from the center of winding to the outer of winding) and wind outer surfaces of the spherical contactors 1a as if they are embraced, each of the spherical contactors 1a can be reliably connected to each of the spiral contactors 20.

In other words, each of the spherical contactors 1a and each of the spiral contactors 20 constitute a connection device for electrically connecting the electronic part 1 with other electronic circuits on the printed board 30.

Figure 5:
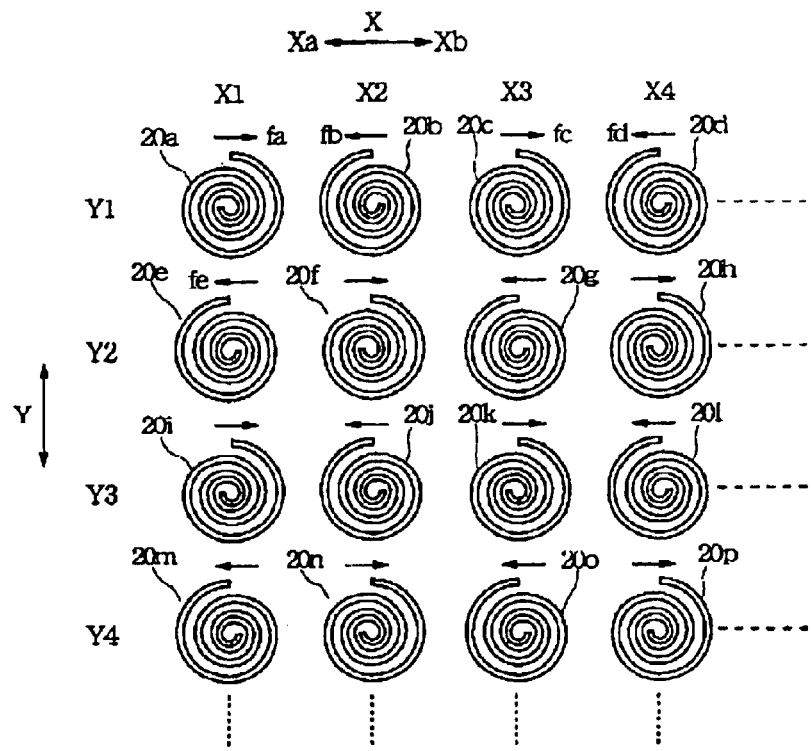
FIG. 5 is a view illustrating an arrangement state of spiral contactors, A being a plan view illustrating a first embodiment and B being a plan view illustrating a second embodiment.
Figure 5:
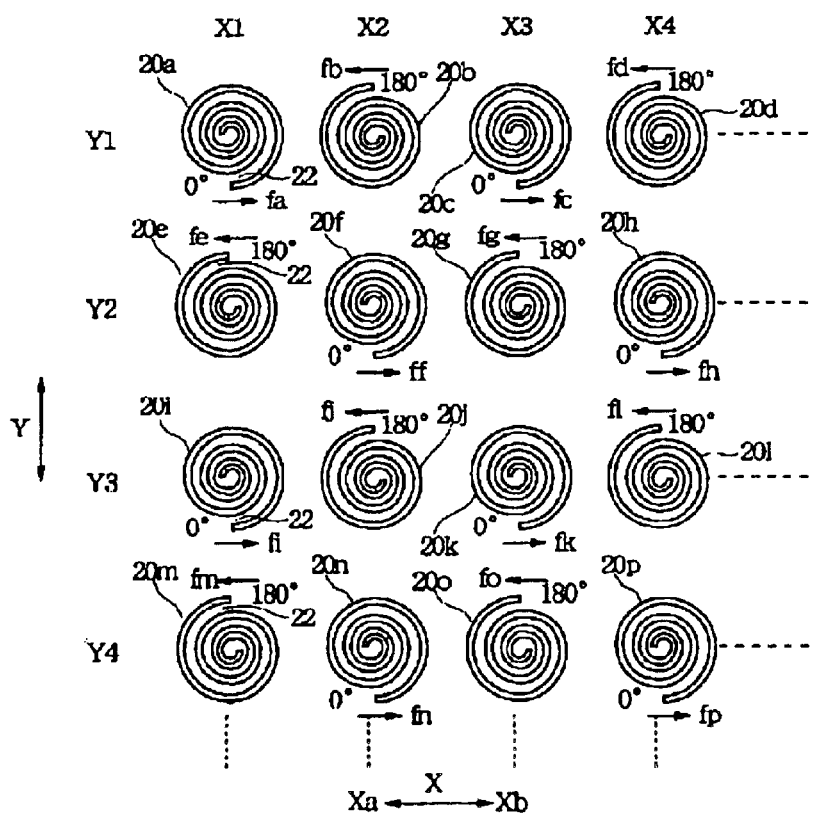

FIG. 5 is a view illustrating an arrangement state of the spiral contactors, A being a plan view illustrating a first embodiment and B being a plan view illustrating a second embodiment. In FIGS. 5A and 5B, X1, X2, . . . , Xn in a shown X direction represent columns, and Y1, Y2, . . . , Yn in a shown Y direction represent rows. The spiral contactors 20 are provided at positions at which the columns intersect the rows, coordinates of which will hereinafter be represented as (Xk, Yk) (where K is an any integer).

As shown in FIG. 5A, in the first embodiment, the winding direction (the spiral direction from the starting end 22 of the winding to the terminal end 23 of the winding) of the spiral contactor 20a positioned at (X1, Y1) is a clockwise direction, but the winding direction of the spiral contactor 20b at an adjacent position (X2, Y1) is set to the counterclockwise direction, the spiral contactor 20c at (X3, Y1) is set to the clockwise direction, and the spiral contactor 20d at (X4, Y1) is set to the counterclockwise direction. Further, the winding direction of the spiral contactor 20e positioned at (X1, Y2) is set to the counterclockwise direction, the spiral contactor 20i at (X1, Y3) is set to the clockwise direction, and the spiral contactor 20m at (X1, Y4) is set to the counterclockwise direction. In other words, in the first embodiment, adjacent spiral contactors 20 are arranged such that their winding directions are opposite to each other.

Considering tensile stress applied between the spiral contactors 20 arranged in the first row (Y1 row) shown in FIG. 5A, for example, the direction of tensile stress fa of the spiral contactor 20a positioned at (X1, Y1) is the Xb direction, shown along the tangential direction of the spiral contactors from the starting end 22 of the winding. Similarly, the direction of tensile stress fb of the spiral contactor 20b positioned at (X2, Y1) is the Xa direction, the direction of tensile stress fc of the spiral contactor 20c at (X3, Y1) is the Xb direction, and the direction of tensile stress fd of the spiral contactor 20d at (X4, Y1) is the Xa direction.

In addition, these relations are true of the second row (Y2 row) and below. In other words, in the first embodiment, adjacent spiral contactors 20 for each row are arranged such that the directions of tensile stresses applied to them are opposite to each other so that the tensile stresses between adjacent spiral contactors 20 can cancel each other out.

On the other hand, in the second embodiment shown in FIG. 5B, the winding directions of all spiral contactors 20 are the same (counterclockwise direction in this embodiment), but there is 180° deviation between the spiral contactors 20 where positions of the starting ends 22 of the windings are at positions adjacent in the X and Y directions. For example, the starting end 22 of the winding of the spiral contactor 20a positioned at (X1, Y1) is formed at the position of an angle of 0°, but the starting end 22 of the winding of the spiral contactor 20e positioned at (X1, Y2) is formed at the position of an angle of 180°, the starting end 22 of the winding of the spiral contactor 20i positioned at the shown (X1, Y3) is formed at the position of an angle of 0°, and the starting end 22 of the winding of the spiral contactor 20m positioned at the shown (X1, Y4) is formed at the position of an angle of 0°.

In the second embodiment, as shown in FIG. 5B, for a first column (X1 column), for example, the direction of tensile stress fa of the spiral contactor 20a positioned at (X1, Y1) is the Xb direction shown in the position of an angle of 0°, and the direction of tensile stress fe of the spiral contactor 20e at (X1, Y2) is the Xa direction shown in the position of an angle of 180°. Similarly, the direction of tensile stress fi of the spiral contactor 20i at (X1, Y3) is the Xb direction shown in the position of an angle of 0°, and the direction of tensile stress fm of the spiral contactor 20m at (X1, Y4) is the Xa direction shown in the position of an angle of 180°.

In addition, for a second column (X2 column), for example, the direction of tensile stress fb of the spiral contactor 20b at (X2, Y1) is the Xa direction shown in the position of an angle of 180°, and the direction of tensile stress ff of the spiral contactor 20f at (X2, Y2) is the Xb direction shown in the position of an angle of 0°. Similarly, the direction of tensile stress fj of the spiral contactor 20j at (X2, Y3) is the Xa direction shown in the position of an angle of 180°, and the direction of tensile stress fn of the spiral contactor 20n at (X2, Y4) is the Xb direction shown in the position of an angle of 0°.

Similarly, for a third column (X3 column) and a fourth column (X4 column), the tensile stresses f of the spiral contactors 20c, 20k, 20h and 20p have the Xb direction in the position of an angle of 0°, and the tensile stresses f of the spiral contactors 20g, 20o, 20d and 20l have the Xa direction in the position of an angle of 180°. In addition, as shown in FIG. 5B, the tensile stresses of the spiral contactors 20c, 20k, 20h, 20p, 20g, 20o, 20d and 20l are respectively fc, fk, fh, fp, fg, fo, fd and fl, respectively.

Accordingly, in the first column (X1 column), the tensile stress fa and the tensile stress fe cancel each other out, and the tensile stress fi and the tensile stress fm cancel each other out. In the second column (X2 column), the tensile stress ff and the tensile stress fj cancel each other out. Similarly, in the third column (X3 column), the tensile stress fc and the tensile stress fg cancel each other out, and the tensile stress fk and the tensile stress fo cancel each other out. In the fourth column (X4 column), the tensile stress fh and the tensile stress fl cancel each other out.

In other words, in the second embodiment, it becomes possible for the tensile stresses to cancel each other out between the spiral contactors 20 adjacent to each other in the Y direction and where the starting ends 22 of the windings approach each other.

In the first and second embodiments, since most of the tensile stresses applied to the plurality of spiral contactors arranged in the form of a matrix in the X and Y directions in the loading region 11A can be cancelled, distortion generated in the base stand 11 can be minimized. Accordingly, since the spiral contactors can be flexibly modified, and the occurrence of contact fault between the spherical contactors 1a and the spiral contactors 20 can be prevented, electrical connection between them can be stabilized.

In the inspecting device 10, power is supplied in a state where the electronic part 1 is mounted into the loading region 11A of the base stand 11. In addition, by exchanging signals between the electronic part 1 and other electronic parts on the printed board 30 through the connection device, comprising the spherical contactors 1a and the spiral contactors 20, a test for confirming the operation of the electronic part 1 is carried out.

In addition, in the second embodiment of FIG. 5B, the spiral directions of adjacent spiral contactors 20 are opposite to each other. Accordingly, in a case where the directions of current phases of signals are the same, as shown in FIG. 2B, the directions of the magnetic fields H generated in adjacent spiral contactors 20 are opposite to each other. For example, assuming that the direction of the magnetic field H generated in the spiral contactor 20f at (X2, Y2) shown in FIG. 5B is perpendicular to the paper and is a direction from the back side of the paper to the surface of the paper, the directions of the magnetic fields H generated in four spiral contactors 20b, 20e, 20g and 20j surrounding this spiral contactor 20f are opposite to the direction of the magnetic field H of the spiral contactor 20f (i.e., directions perpendicular to the paper, and directions from the surface of the paper to the back side of the paper. In addition, this relation is true of all of the spiral contactors 20.

Accordingly, the magnetic field H generated in a specific spiral contactor 20 can be cancelled by magnetic fields H generated in other spiral contactors 20 surrounding the specific spiral contactor. Accordingly, the effect of the magnetic field H on internal circuits of the electronic part 1 or the printed board 30 can be significantly suppressed, and it becomes possible to prevent malfunction of the electronic part 1 due to electronic noises.

In addition, in the first embodiment of FIG. 5A, by applying signals having a difference of 180° between their phases to adjacent spiral contactors 20, it is possible to reduce the effect of the magnetic field, as in the second embodiment.

As described above, in the present invention, contact between the external connectors (spherical contactors) of electrical parts and spiral contactors can be stabilized.

What is claimed is:

1. A connection device comprising a substrate and a plurality of spiral contactors formed in a spiral shape on the substrate, a plurality of external connectors of electronic parts making contact with the plurality of spiral contactors, respectively, wherein the directions of tensile stresses applied to the starting ends of the windings of the spiral contactors are arranged opposite to each other, between adjacent spiral contactors.

2. The connection device according to claim 1,
wherein the spiral directions of adjacent spiral contactors are opposite to each other.
3. The connection device according to claim 1,
wherein the concaves are arranged in the form of a matrix.
4. The connection device according to claim 1,
wherein the concaves are through-holes, the inner walls of which are provided with conductors, each being conductive with each of the spiral contactors.
5. The connection device according to claim 1,
wherein the tip of each of the external connectors is formed in the form of sphere.

6. The connection device according to claim 1,
wherein the spiral directions of adjacent spiral contactors are in the same direction, and the positions of the starting ends of the windings of the spiral contactors deviate from each other by 180°.
7. The connection device according to claim 3,
wherein concaves are formed in the substrate, the starting ends of the windings of the spiral contactors are provided at the edge portions of the concaves, and the terminal ends of the windings of the spiral contactors are provided at the centers of the concaves.

* * * * *